(12) United States Patent
Kondo

(10) Patent No.: US 6,967,894 B2
(45) Date of Patent: Nov. 22, 2005

(54) NON-VOLATILE SEMICONDUCTOR MEMORY DEVICE AND ELECTRIC DEVICE WITH THE SAME

(75) Inventor: Yoshihisa Kondo, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 10/829,267

(22) Filed: Apr. 22, 2004

(65) Prior Publication Data

US 2005/0135183 A1    Jun. 23, 2005

(30) Foreign Application Priority Data

Dec. 17, 2003   (JP) ............................ 2003-419383

(51) Int. Cl.⁷ .............................................. G11C 8/00
(52) U.S. Cl. ............. 365/233; 365/185.17; 365/230.06
(58) Field of Search ........................... 365/233, 185.17, 365/230.06

(56) References Cited

U.S. PATENT DOCUMENTS

| 6,567,319 B2 * | 5/2003 | Sato et al. ............. 365/189.09 |
| 6,570,814 B2 * | 5/2003 | Farmwald et al. .......... 365/233 |
| 6,715,020 B2 * | 3/2004 | Farmwald et al. .......... 365/233 |

FOREIGN PATENT DOCUMENTS

JP            10-302488       11/1998

* cited by examiner

Primary Examiner—Tuan T. Nguyen
(74) Attorney, Agent, or Firm—Oblon, Spivak, McClelland, Maier & Neustadt, P.C.

(57) ABSTRACT

A non-volatile semiconductor memory device has a memory core circuit including a cell array in which electrically rewritable and non-volatile memory cells are arranged therein, decoders configured to select the memory cells, and sense amplifiers configured to perform data read and write of the cell array, and a peripheral circuit including a memory controller configured to control data read and write in communication with the memory core circuit, wherein the memory controller has: an oscillator configured to generate an internal clock signal; a timing control circuit configured to timing control timings of data read and write of the cell array as synchronous with the internal clock signal; and a merge clock generation circuit configured to generate based on an external timing signal and the internal clock signal a merge clock signal serving for timing controlling a circuit portion in the peripheral circuit, the merge clock signal being defined as having a first signal period in which the external timing signal serves as a clock source and a second signal period without overlapping the first signal period, in which the internal clock signal serves as a clock source.

12 Claims, 8 Drawing Sheets

NON-VOLATILE SEMICONDUCTOR MEMORY DEVICE AND ELECTRIC DEVICE WITH THE SAME

CROSS-REFERENCE TO RELATED APPLICATION

This application is based on and claims the benefit of priority from the prior Japanese Patent Application No. 2003-419383, filed on Dec. 17, 2003, the entire contents of which are incorporated herein by reference.

BACKGROUND OF THE INVENTION

1. Field of the Invention

This invention relates to a non-volatile semiconductor memory device and an electric device with the same.

2. Description of Related Art

A NAND-type flash memory is known as an EEPROM which may be constructed with a large capacity due to that this flash memory is formed by arranging NAND cell units each having plural memory cells connected in series. In such the NAND-type flash memory, data erase is usually performed in a way that one block serves as an erase unit, where one block is defined as a group of NAND cell units arranged in the direction of word lines. Recently, for the purpose of improving data rewrite performance of a flash memory with a large capacity, it has been provided a NAND-type flash memory in which data erase is performed by a page (e.g., refer to Japanese Patent Application Laid Open No. 10-302488).

An EEPEOM such as the NAND-type flash memory has, in general, a complicated peripheral circuit around a memory core circuit which includes cell array, decoder and sense amplifier circuit. The peripheral circuit includes a controller for executing data read control and data write/erase sequence control, command and address circuits which are activated by external timing signals to operate, high voltage generation circuits controlled by the controller to output various high voltages necessary for the respective operation modes, and the like.

The controller in the peripheral circuit is a synchronous circuit which outputs various timing signals as synchronous with a clock output from an internal oscillator. In contrast, the command circuit and address circuit are non-synchronous ones each having an event activated by an external timing signal supplied from external of the chip and another event activated by an internal timing signal output from the controller.

Read operation will be explained in detail bellow. Input a write enable signal WEn, and input command and address data, and the controller is activated. Data read of selected cells is performed under the timing control of the controller. When such the internal data read operation is finished, the controller stops its control operation. Then, input a read enable signal REn from the external, and data output operation is performed for outputting the read data in the sense amplifier circuit to the external of the chip.

In the above-described data read operation, for example, an address counter is incremented in response to the read enable signal REn. At a data write time, the address counter is incremented in response to the write enable signal WEn. On the other hand, there is a prefetch operation for prefetching the read data in the sense amplifier to a data buffer under the control of the controller. In this case, the address counter is incremented synchronously with the internal clock.

The peripheral circuit has, as described above, a complicated configuration including non-synchronous circuits. Especially, in case a multi-value storing scheme, in which one memory cell stores multi-level data, is used, the complexity of the peripheral circuit is more increased. Therefore, there is a large problem that develop period and develop resources of the flash memory are increased.

Usually, a top down designing scheme is adapted to a logic LSI. That is, perform RTL level designing by use of HDL such as Verilog, then generate circuits by a logic composition tool, and a logic LSI may be designed. This scheme, however, may not be applied to the above-described peripheral circuit with non-synchronous circuits in the flash memory as it is.

SUMMARY OF THE INVENTION

According to an aspect of the present invention, there is provided a non-volatile semiconductor memory device including:

a memory core circuit including a cell array in which electrically rewritable and non-volatile memory cells are arranged therein, decoders configured to select the memory cells, and sense amplifiers configured to perform data read and write of the cell array; and a peripheral circuit including a memory controller configured to control data read and write in communication with the memory core circuit, wherein the memory controller has:

an oscillator configured to generate an internal clock signal;

a timing control circuit configured to control timings of data read and write of the cell array as synchronous with the internal clock signal; and a merge clock generation circuit configured to generate based on an external timing signal and the internal clock signal a merge clock signal serving for timing controlling a circuit portion in the peripheral circuit, the merge clock signal being defined as having a first signal period in which the external timing signal serves as a clock source and a second signal period without overlapping the first signal period, in which the internal clock signal serves as a clock source.

DETAILED DESCRIPTION OF THE EMBODIMENTS

Figure 1:
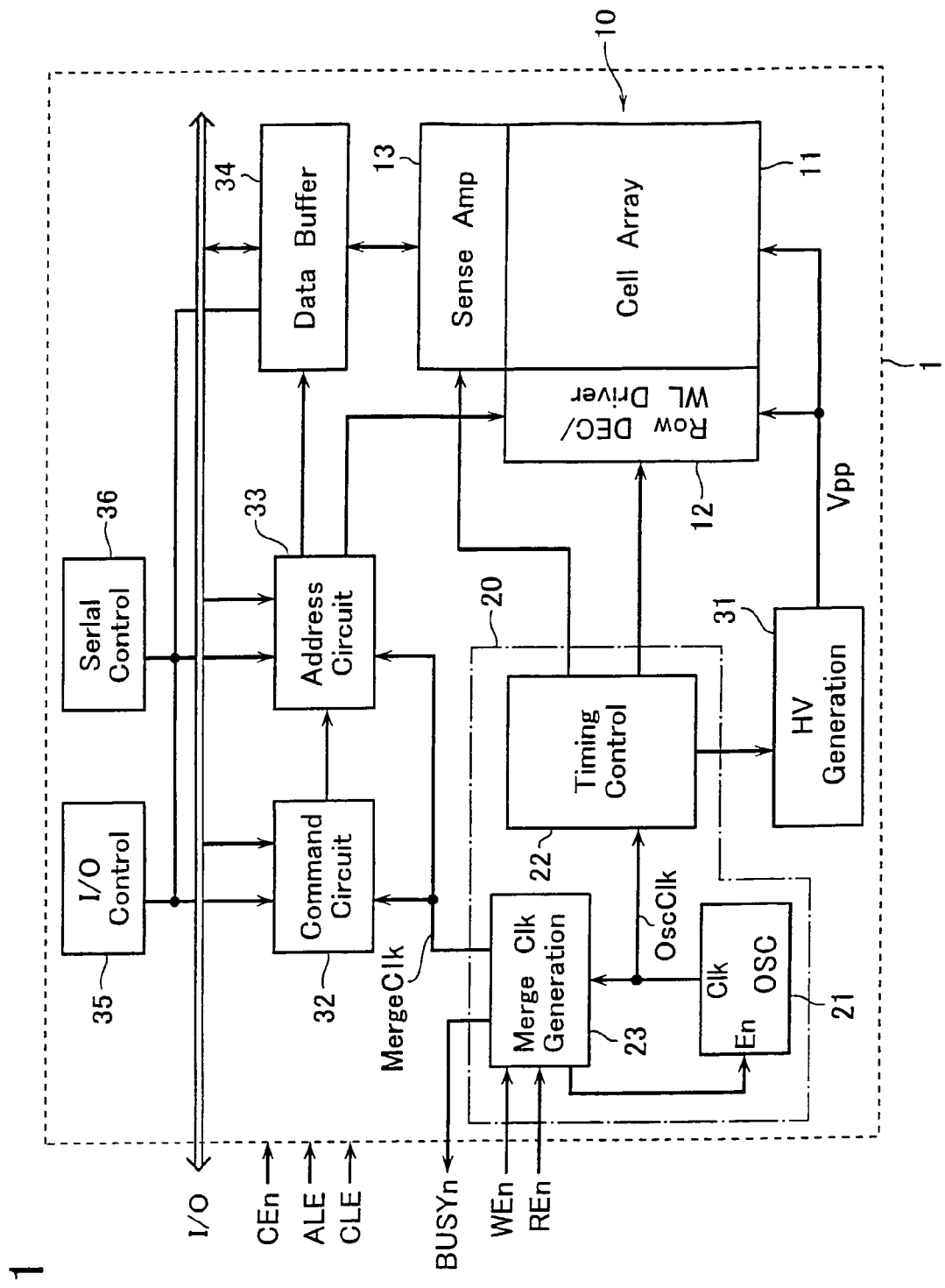
FIG. 1 shows a functional block configuration of a flash memory in accordance with an embodiment of the present invention.

Illustrative embodiments of this invention will be explained with reference to the accompanying drawings below. FIG. 1 shows a functional block configuration of a NAND-type flash memory in accordance with an embodiment of the present invention. A memory chip 1 has a memory core circuit 10 and a peripheral circuit including a memory controller 20. The memory core circuit 10 has a cell array 11, row decoder (including word line driver) 12 for selecting word lines of the cell array 11 and sense amplifier circuit 13 connected to the bit lines of the cell array 11 to perform data read and write.

Figure 2:
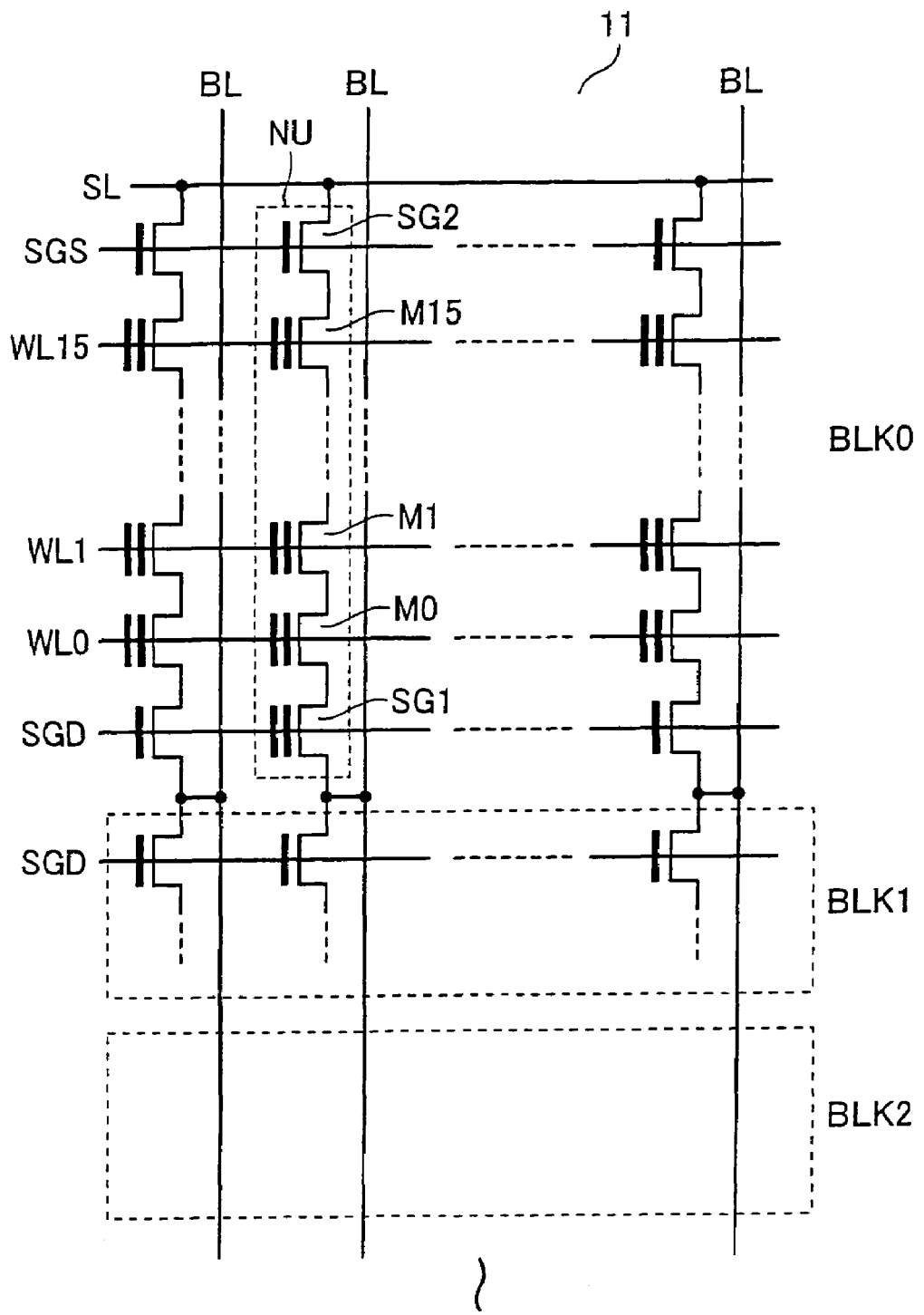
FIG. 2 shows a cell arrangement of the flash memory.

The cell array 11 is, as shown in FIG. 2, formed of NAND cell units NU arranged therein, each of which is formed of a plurality of memory cells M0-M15 connected in series. Control gates of the memory cells M0-M15 in each NAND cell unit NU are connected to different word lines WL0-WL15, respectively. One end of the NAND cell unit NU is connected to a bit line BL, which is disposed to intersect the word lines WL, via a select gate transistor SG1, and the other end to a source line SL via another select gate transistor SG2. Gates of the select gate transistors SG1 and SG2 are connected to select gate lines SGD and SGS disposed in parallel with the word lines WL, respectively.

A group of the NAND cell units NU arranged in the direction of the word lines WL constitutes a block serving as a unit of data erase. As shown in FIG. 2, plural blocks BLK (BLK0, BLK1, BLK2, . . . ) are arranged in the direction of the bit lines BL. A group of memory cells arranged along a word line WL in each block constitutes a page serving as a unit of data read and write. Usually, data erasure is preformed by a block as described above. However, it in not limited to such an erase scheme. For example, for the purpose of efficient data rewrite, it is also possible to perform data erase by a page or by a sub-block including plural and continuous pages.

The memory cell is formed of a MOS transistor which has, for example, a floating gate serving as a charge storing layer in a gate insulating film thereof. This memory cell stores data in a non-volatile manner based on the amount of charge stored in the floating gate. Data of the memory cell is electrically rewritable in accordance with charge-injection into or charge-release from the floating gate. For example, the memory cell stores binary data "0" as a high threshold voltage state (e.g., positive threshold state) obtained by electron injection into the floating gate, or data "1" as a low threshold voltage state (e.g., negative threshold state) obtained by electron releasing from the floating gate.

In the NAND flash memory in accordance with this embodiment, data write is performed by a page. In a data write cycle, firstly, the channels of selected cells are precharged to Vss and Vcc-Vth (Vth is a threshold voltage of the select transistor) in accordance with write data "0" and "1", respectively. In this state, next, apply a write voltage Vpgm to a selected word line, and apply an intermediate voltage Vpass to non-selected word lines. As a result, electron injection into the floating gate takes place in a cell to which "0" data is supplied, thereby increasing threshold voltage thereof. Electron injection is not generated in a cell to which "1" data is supplied, due to that the floating channel is boosted by capacitive coupling from the control gate.

Practical data write is, for the purpose of controlling the data threshold distribution, performed with a sequence-control in a way that a write cycle, including a write pulse application and verify-read thereafter is repeated until all write data have been written. Memory controller 20 executes such the write sequence control.

Data read is also done by a page. In a read mode, apply a read voltage necessary for judging "0" and "1", for example 0V, to a selected word line; apply a pass voltage Vread necessary for turning on cells without regard to cell data to non-selected word lines; and simultaneously turn-on the select gate transistors. Data judgment may be performed by detecting whether cell current flows or not. In practice, bit lines are precharged to, for example, Vcc by sense amplifiers prior to cell data sensing. Then, the sense amplifiers detect whether the bit lines are discharged or not by the respective NAND cell units, whereby cell data may be determined. The bit line precharge and following cell data reading also are controlled by memory controller 20.

Data erase is usually done by a block. In a data erase mode, 0V is applied to word lines in a selected block, and an erase voltage Vera a p-type well on which the cell array is formed. As a result, electron of floating gates in the entire cells in the block are released, whereby erase states, i.e., "1" data states, may be obtained.

The memory controller 20 outputs timing signals to the sense amplifier circuit 13, row decoder 12 and the like so as to control the data read operation and sequentially control the data write and erase in the data read, write and erase modes.

The peripheral circuit also includes, in addition to the memory controller 20, a command circuit 32 for decoding command data supplied from the external, an address circuit 33 for holding address data supplied from the external and high voltage generation circuit 31 for outputting various high voltages, Vpp, necessary for writing and erasing the cell array 11. Although the detail has been omitted, the address circuit 33 has address registers for holding row address to be supplied to the row decoder 12 and column address to be supplied to column select gates in the data buffer 34, and an address counter serving for address-incrementing in accordance with operation modes.

An I/O control circuit 35 controls for inputting command and address data to the command circuit 32 and address circuit 33 based on command latch enable signal CLE and address latch enable signal ALE, respectively. A serial control circuit 36 controls the address circuit 33 to serially transfer 1-page read data and 1-page write data between the external I/O terminal and the sense amplifier circuit 13.

The memory controller 20 has an oscillator 21 for generating an internal clock signal, OscClk, and a timing control circuit 22. The timing control circuit 22 outputs internal timing signals to be supplied to the memory core circuit 10, thereby doing timing control of data read and write of the cell array 11. The memory controller 20 further includes a merge clock generation circuit 23 which generates a merge clock signal, MergeClk, based on the internal clock signal OscClk and external timing signals, i.e., write enable signal WEn and read enable signal REn.

The merge clock signal, MergeClk, is supplied to command circuit 32 and address circuit 33. In response to this, the command circuit 32 and address circuit 33 output timing control signals. Note here, that these circuits in the prior art is configured to output timing signals in response to the external timing signals write enable signal WEn and read enable signal REn. In contrast to this, in this embodiment, these command circuit 32 and address circuit 33 are controlled by the merge clock signal MergeClk.

The merge clock generation circuit 23 is, as described later, configured to merge or mix the write enable signal WEn, read enable signal REn supplied from the external and the internal clock signal OscClk following upon it with a certain blanking period so as to output the merge clock signal MergeClk.

To generate the above-described merge clock signal MergeClk, it is required that the oscillator 21 has an enable terminal (En) to start an oscillation operation when the memory controller 20 is activated. The detail will be explained later. By use of the merge clock signal MergeClk, it becomes possible to apply a top-down designing scheme for the peripheral circuit including not only the memory controller 20 but also command circuit 32 and address circuit 33.

Figure 3:
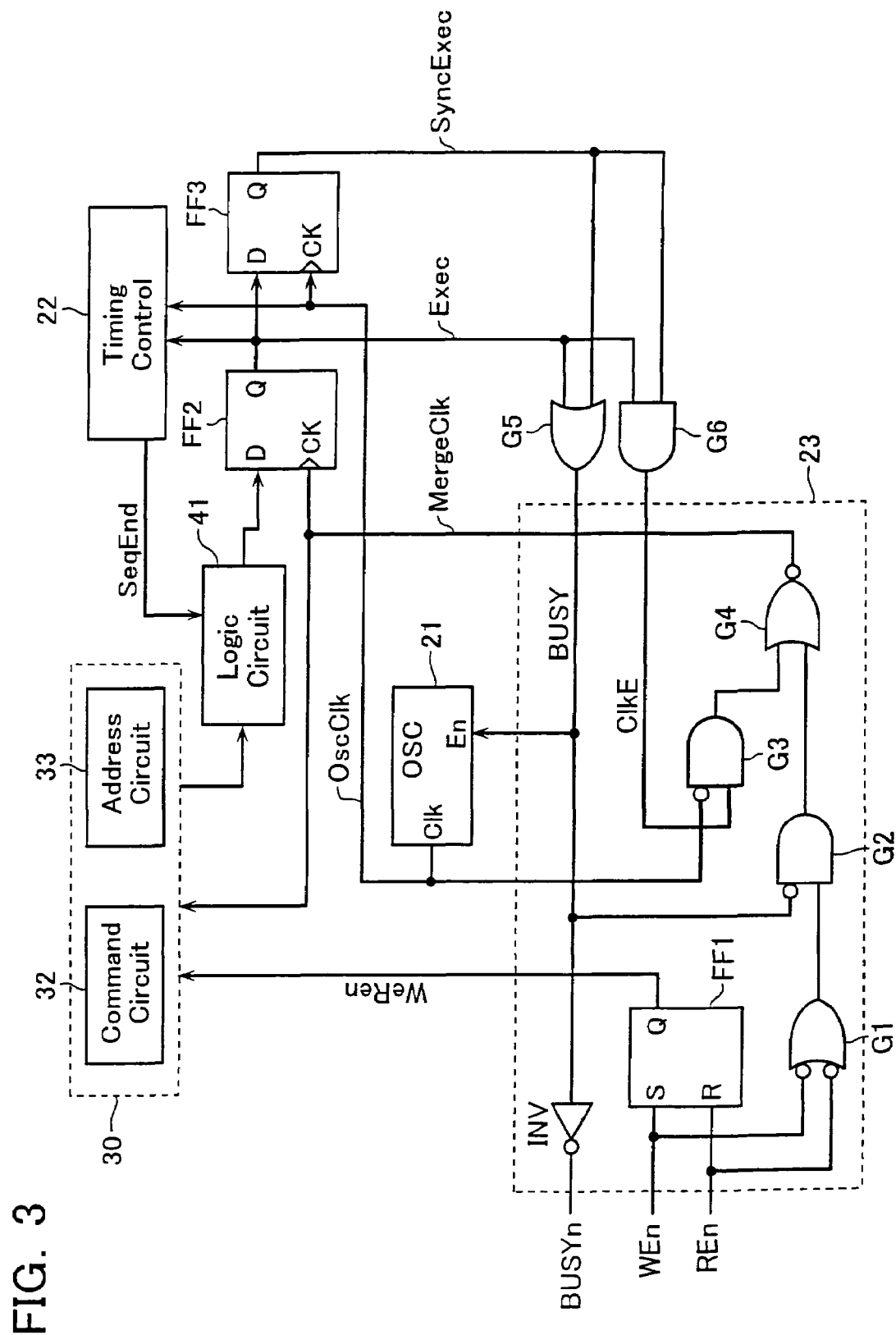
FIG. 3 shows a detailed configuration of a peripheral circuit portion including a memory controller in the flash memory.
Figure 5:
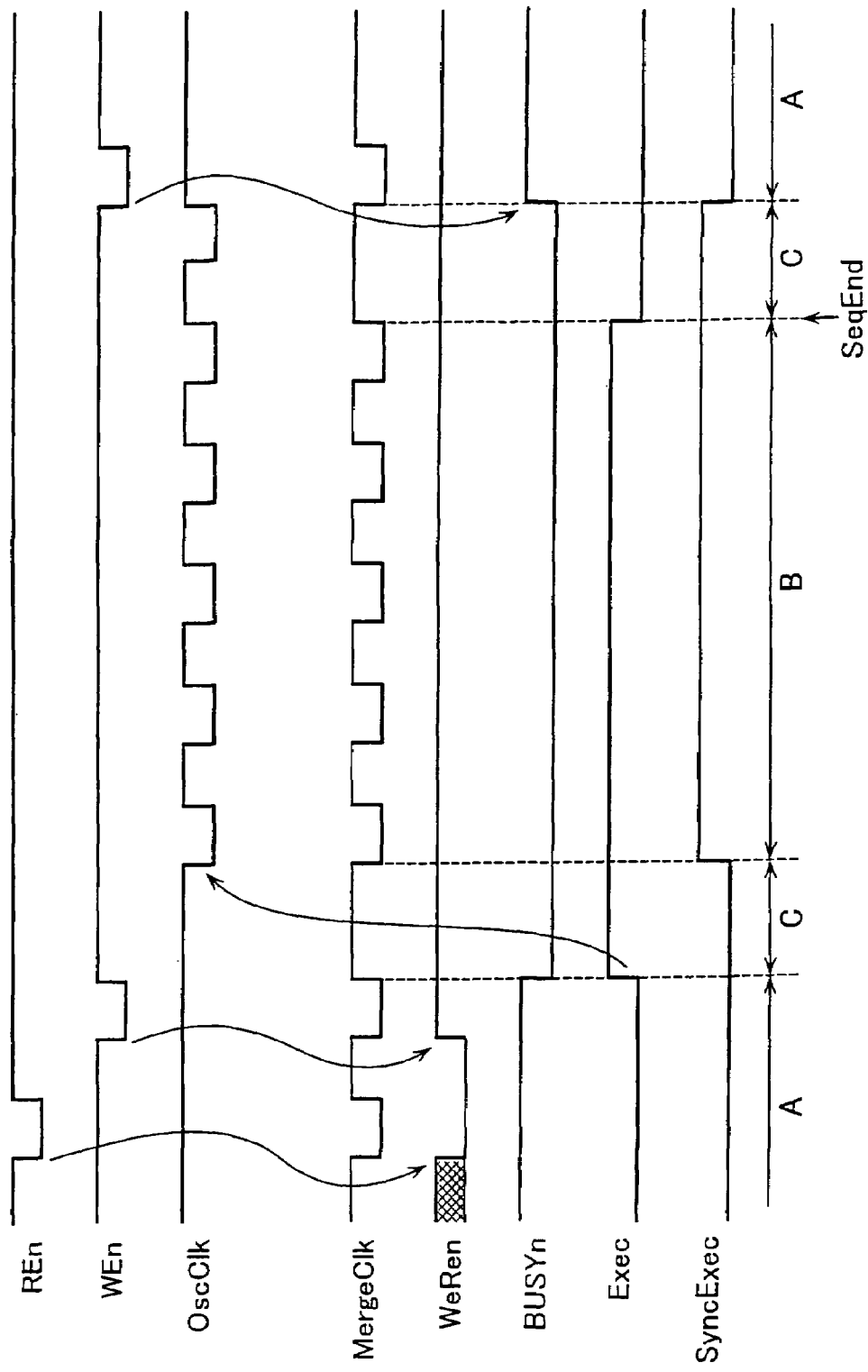
FIG. 5 shows a timing chart for explanation of a clock method of the flash memory.

FIG. 3 shows a detailed arrangement of the merge clock generation circuit 23 including additional circuits omitted in FIG. 1. FIG. 5 is an operation timing chart of the merge clock generation circuit 23.

RS flip-flop FF1 has set and reset input nodes, to which write enable signal WEn and read enable signal REn are input, respectively. Therefore, the flip-flop FF1 outputs a signal, WeRen, which becomes "H" at the fall edge of write enable signal WEn and becomes "L" at the fall edge of read enable signal REn. This signal WeRen is supplied to a peripheral circuit portion 30 including the command circuit 32 and address circuit 33 for serving as a mode determining signal for determining which of write and read modes is selected.

When address and/or command data is input to the peripheral circuit portion 30 synchronously with the write enable signal WEn or read enable signal REn, a combination logic circuit 41 determines an activation condition based on a combination logic therebetween. In response to the output of this combination logic circuit 41, an execute flag, Exec, which indicates that the memory controller 20 is activated, is set or reset. The execute flag Exec is supplied to the timing control circuit 22 along with the internal clock signal OscClk output from the oscillator 21. Explaining in other words, the execute flag Exec serves as a signal for activating the timing control circuit 22 which is to operate synchronously with the internal clock signal OscClk.

The execute flag Exec is set or reset as synchronized with the external timing signal, i.e., write enable signal WEn or read enable signal REn. When the execute flag is "L", the oscillator 21 is held at a disable state, while an AND gate G2 is activated. If write enable signal WEn or read enable signal REn is input during such the state, it passes through OR gate G1, AND gate G2 and NOR gate G4 to be output as the merge clock signal MergeClk. This merge clock signal MergeClk is input to a clock input node of a D-type flip-flop FF2. In response to the merge clock signal MergeClk and the output of the combination logic circuit 41, the flip-flop FF2 outputs the execute flag, Exec="H".

The execute flag Exec is output to the external as a busy signal BUSYn via OR gate G5 and inverter INV. Further, becoming "H", the execute flag Exec controls AND gate G2 to be inactive, and input to the enable terminal of the oscillator 21 via the OR gate G5, whereby the oscillator 21 starts oscillation with a certain delay time. The internal clock signal OscClk output from the oscillator 21 is input to an clock node of another D-type flip-flop FF3 to the data node of which the output of the flip-flop FF2 is input. Therefore, the flip-flop FF3 outputs a synchronous execute flag, SyncExec, which is delayed from the execute flag Exec by one cycle of the internal clock signal OscClk.

The synchronous execute flag SyncExec defines a start timing of a period for outputting the internal clock signal OscClk as the merge clock signal MergeClk. In detail, the execute flag Exec and synchronous execute flag SyncExec are input to an AND gate G6. The AND gate G6 outputs a clock enable signal, ClkE, which becomes "H" during both the execute flag Exec and synchronous execute flag SyncExec are "H". This clock enable signal ClkE activating the AND gate G3, the internal clock signal OscClk output from the oscillator 21 passes through AND gate G3 and NOR gate G4 to be output as the merge clock signal MergeClk.

By use of above-described merge clock generation circuit 23, the merge clock signal MergeClk is, as shown in FIG. 5, generated with a signal period A in which the internal clock signal OscClk becomes a clock source and a signal period B in which the external timing signal such as the write enable signal WEn or read enable signal REn becomes a clock source. In detail, OR gate G5 produces an OR logic output of the execute flag Exec and synchronous execute flag SyncExec that is generated by sampling the execute flag Exec with the internal clock signal OscClk, to control AND gate G2, whereby write enable signal WEn or read enable signal REn is drawn as the merge clock signal MergeClk in the signal period A. AND gate G6 produces an AND logic output of the execute flag Exec and synchronous execute flag SyncExec to control AND gate G3, whereby the internal clock signal OscClk is drawn as the merge clock signal MergeClk in the signal period B.

AND gates G2 and G3 are held in an inactive state until when the synchronous execute flag becomes "H" after the execute flag Exec becomes "H". Therefore, a clock blanking period C is secured between the signal periods A and B due to an activation delay function of the oscillator 21.

The merge clock signal MergeClk generated as described above being supplied to the circuit portion 30, and the internal clock signal OscClk to the timing control circuit 22, timing control may be performed for reading and writing. When the combination logic circuit 41 detects an operation end signal SeqEND output from the timing control circuit 22, the execute flag Exec becomes "L". After the execute flag Exec having become "L", the oscillator 21 continues its oscillation operation based on the synchronous execute flag SyncExec. When the synchronous execute flag SyncExec becomes "L" as delayed by one clock cycle, the oscillator 21 stops its oscillation. The execute flag Exec becoming "L", AND gate G3 becomes inactive. In addition, AND gate G2 also is in an inactive state until when the synchronous execute flag SyncExec becomes "L". Therefore, the clock blanking period C with one clock cycle in time length is secured after the execute flag Exec having become "L".

According to this embodiment as described above, combining or mixing an external timing signal such as write enable signal WEn or read enable signal REn and an internal clock signal OscClk, a merge clock signal MergeClk is generated. The merge clock signal MergeClk is supplied to the address circuit 33 and command circuit 32, while the internal clock signal OscClk to the timing control circuit 22.

By use of the above-described merge clock signal MergeClk, it becomes possible to regard the peripheral circuit portion 30 including the timing control circuit 22 controlled by the internal clock signal OscClk and address circuit 33, command circuit 32 to be controlled by the external timing signal as a synchronous circuit. In other words, the peripheral circuit portion 30 may be designed by logic composition with a top-down design method. Therefore, it may be provided a NAND flash memory with high design efficiency.

An external device may determine, based on the busy signal BUSYn, whether the memory chip is in a busy state (signal period B) or in a ready state as being permitted to supply an external timing signal (signal period A). Further, using the mode determining signal WeRen along with the busy signal BUSYn, it is possible to perform memory operation control, while determining which clock source is presently used.

A minimum phase difference between the write enable signal WEn and read enable signal REn is usually defined as a specification of a NAND flash memory. In some products, it is permitted that the write enable signal WEn and read enable signal REn are partially overlapped. To apply this invention to such memory products, it is effective to dispose a wave shaping circuit in front of the merge clock generation circuit for separation of the write enable signal WEn and read enable signal REn.

Figure 4:
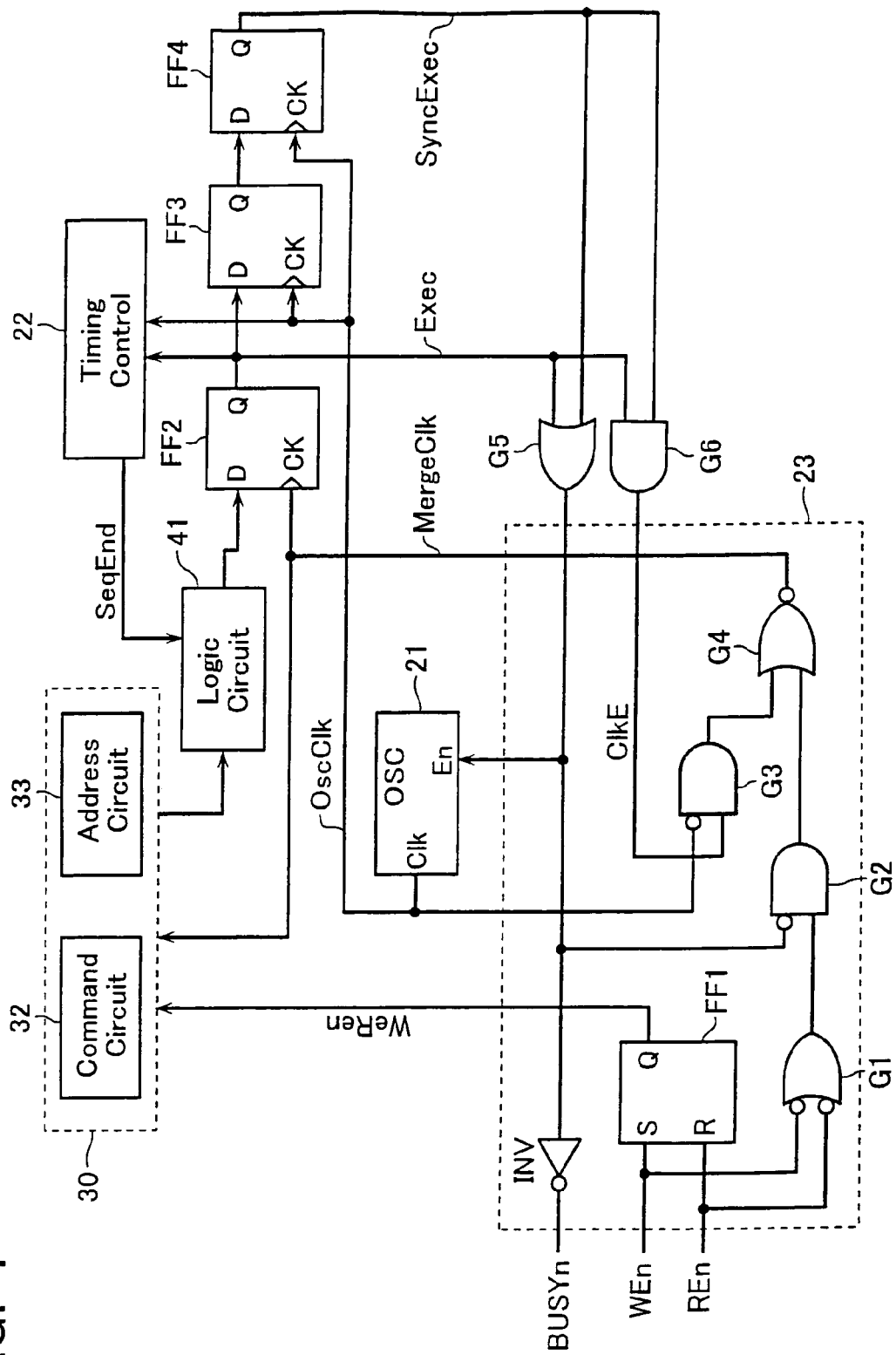
FIG. 4 shows another configuration of the peripheral circuit portion including the memory controller.

FIG. 4 shows another configuration of the merge clock generation circuit 23 including additional circuits. In FIG. 4, the same references being used as in FIG. 3 with respect to the corresponding portions and signals, a detailed explanation will be omitted. In the circuitry shown in FIG. 3, the oscillation delay function of the oscillator 21 is installed therein for securing the clock blanking period C. In contrast to this, arranging two D-type flip-flops FF2 and FF3 at the circuit portion for generating the synchronous execute flag SyncExec based on the execute flag Exec in FIG. 4, the same function as in FIG. 3 is achieved.

As an embodiment, an electric card using the non-volatile semiconductor memory device according to the above-described embodiment of the present invention and an electric device using the card will be described bellow.

Figure 6:
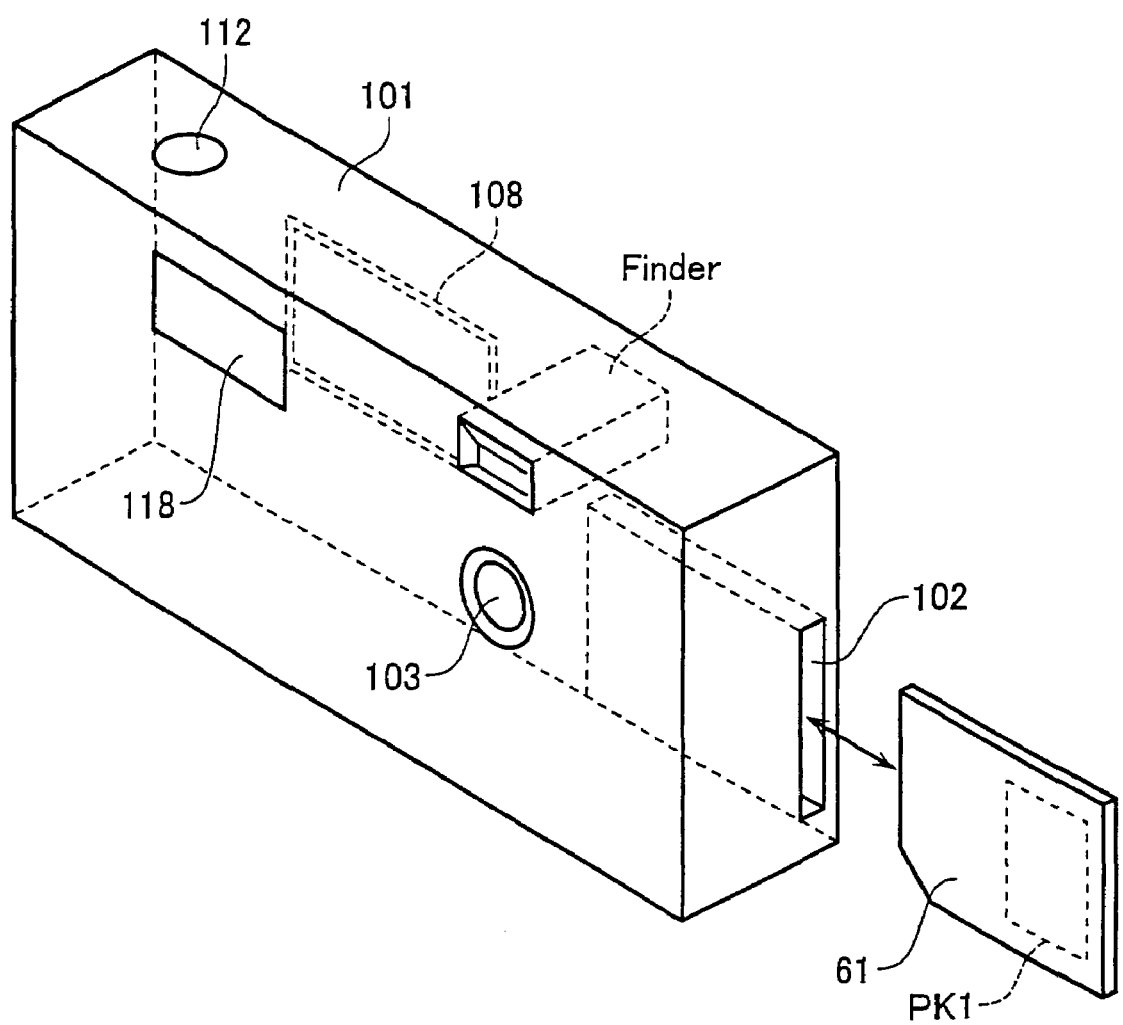
FIG. 6 shows an embodiment applied to a digital still camera.

FIG. 6 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 7:
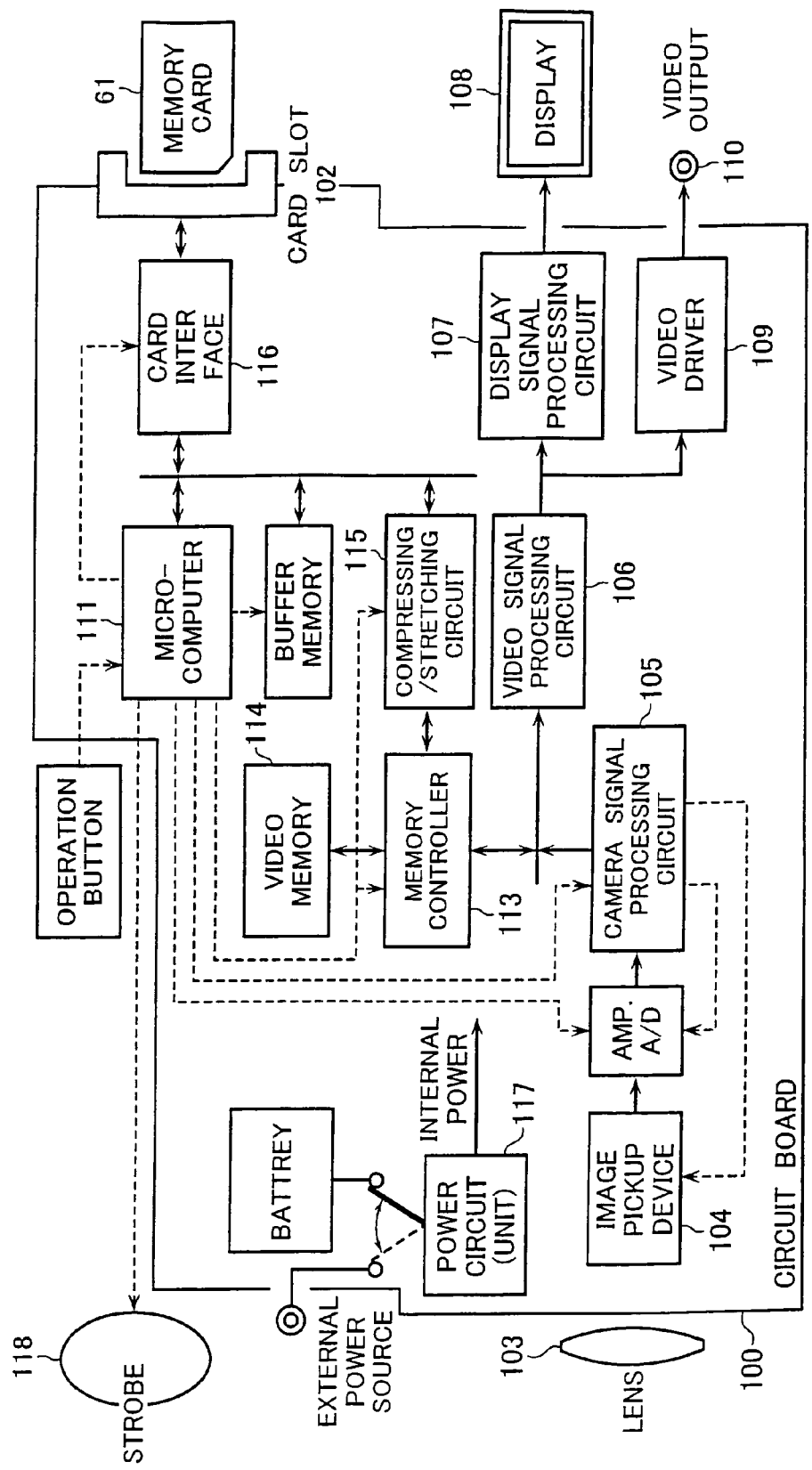
FIG. 7 shows an internal configuration of the digital still camera.
Figure 8A:
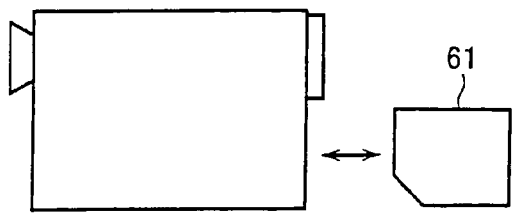
FIGS. 8A to 8J show other electric devices to which the present invention is applied.
Figure 8F:
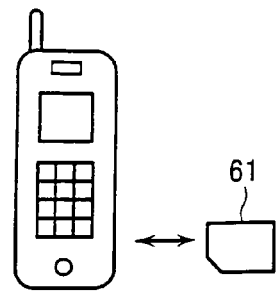
Figure 8B:
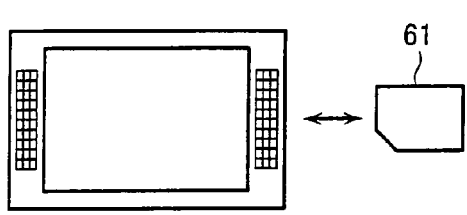
Figure 8G:
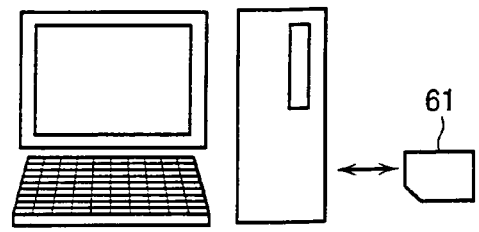
Figure 8C:
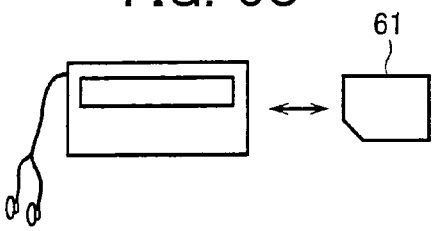
Figure 8H:
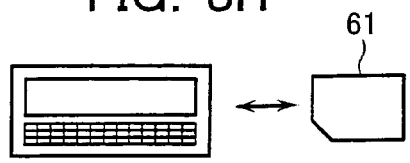
Figure 8D:
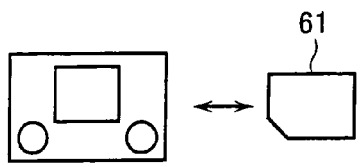
Figure 8I:
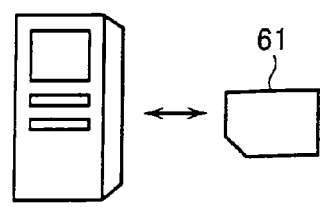
Figure 8E:
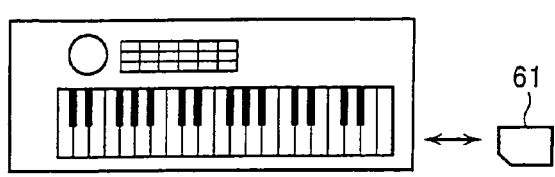
Figure 8J:
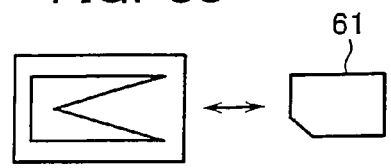

FIG. 7 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 8A to 8J, as well as in portable electric devices. That is, the electric card can also be used in a video camera shown in FIG. 8A, a television set shown in FIG. 8B, an audio apparatus shown in FIG. 8C, a game apparatus shown in FIG. 8D, an electric musical instrument shown in FIG. 8E, a cell phone shown in FIG. 8F, a personal computer shown in FIG. 8G, a personal digital assistant (PDA) shown in FIG. 8H, a voice recorder shown in FIG. 8I, and a PC card shown in FIG. 8J.

This invention is not limited to the above-described embodiment. For example, while it has been explained that the flash memory has a NAND cell array, the present invention may be applied to EEPROMs with other cell array schemes such as AND-type, virtual ground-type, NOR-type and the like. Further, it will be understood by those skilled in the art that various changes in form and detail may be made without departing from the spirit, scope, and teaching of the invention.

What is claimed is:

1. A non-volatile semiconductor memory device comprising:
   a memory core circuit including a cell array in which electrically rewritable and non-volatile memory cells are arranged therein, decoders configured to select the memory cells, and sense amplifiers configured to perform data read and write of said cell array; and
   a peripheral circuit including a memory controller configured to control data read and write in communication with said memory core circuit, wherein
   said memory controller comprises:
   an oscillator configured to generate an internal clock signal;
   a timing control circuit configured to control timings of data read and write of said cell array as synchronous with said internal clock signal; and
   a merge clock generation circuit configured to generate based on an external timing signal and said internal clock signal a merge clock signal serving for timing controlling a circuit portion in said peripheral circuit, said merge clock signal being defined as having a first signal period in which said external timing signal serves as a clock source and a second signal period without overlapping said first signal period, in which said internal clock signal serves as a clock source.

2. The non-volatile semiconductor memory device according to claim 1, wherein
   said circuit portion includes an address circuit having an address register and address counter, and a command circuit configured to decode a command signal.

3. The non-volatile semiconductor memory device according to claim 1, wherein
   said merge clock generation circuit comprises:
   a first logic gate configured to draw said external timing signal to serve as said merge clock signal in said first signal period under the control of an OR logic of an execute flag activating said timing control circuit and a synchronous execute flag generated by sampling said execute flag with said internal clock signal; and
   a second logic gate configured to draw said internal clock signal to serve as said merge clock signal in said second signal period under the control of an AND logic of said execute flag and synchronous execute flag.

4. The non-volatile semiconductor memory device according to claim 1, wherein
   said external timing signal includes write enable signal and read enable signal.

5. The non-volatile semiconductor memory device according to claim 1, wherein
   said external timing signal includes write enable signal and read enable signal, and wherein
   said merge clock signal generation circuit comprises a flip-flop which is set and reset by said write enable signal and read enable signal, respectively, to output an operation mode determining signal supplied to said circuit portion.

6. The non-volatile semiconductor memory device according to claim 3, wherein
   said oscillator is configured to be activated by an OR logic of said execute flag and synchronous execute flag.

7. The non-volatile semiconductor memory device according to claim 1, wherein
   said oscillator is configured to have an activation delay function for securing a clock blanking period between said first and second signal periods.

8. The non-volatile semiconductor memory device according to claim 3, further comprising
   a combination logic circuit configured to set and reset said execute flag based on the operation states of said timing control circuit and said circuit portion.

9. The non-volatile semiconductor memory device according to claim 1, wherein
   said cell array is formed of NAND cell units arranged therein, each NAND cell unit having plural memory cells connected in series.

10. An electric card equipped with a non-volatile semiconductor memory device, said device comprising:
    a memory core circuit including a cell array in which electrically rewritable and non-volatile memory cells are arranged therein, decoders configured to select the memory cells, and sense amplifiers configured to perform data read and write of said cell array; and
    a peripheral circuit including a memory controller configured to control data read and write in communication with said memory core circuit, wherein
    said memory controller comprises:
    an oscillator configured to generate an internal clock signal;
    a timing control circuit configured to control timings of data read and write of said cell array as synchronous with said internal clock signal; and
    a merge clock generation circuit configured to generate based on an external timing signal and said internal clock signal a merge clock signal serving for timing controlling a circuit portion in said peripheral circuit, said merge clock signal being defined as having a first signal period in which said external timing signal serves as a clock source and a second signal period without overlapping said first signal period, in which said internal clock signal serves as a clock source.

11. An electric-device comprising:
    a card interface;
    a card slot connected to said card interface; and
    an electric card defined in claim 10 and electrically connectable to said card slot.

12. The electric device according to claim 11, wherein said electric device is a digital still camera.

* * * * *